United States Patent (10) Patent No.: US 7,430,804 B2
Hou et al. (45) Date of Patent: Oct. 7, 2008

(54) APPARATUS AND METHOD FOR MANUFACTURING HEAT PIPE

(75) Inventors: Chuen-Shu Hou, Tu Cheng (TW);
Chao-Nien Tung, Tu Cheng (TW);
Tay-Jian Liu, Tu Cheng (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 13 days.

(21) Appl. No.: 11/308,730

(22) Filed: Apr. 26, 2006

(65) Prior Publication Data

US 2007/0062038 A1 Mar. 22, 2007

(30) Foreign Application Priority Data

Sep. 21, 2005 (CN) .......................... 200510037460

(51) Int. Cl.
*B21D 53/02* (2006.01)
*B21D 26/02* (2006.01)
*B23P 6/00* (2006.01)
*F28D 15/00* (2006.01)

(52) U.S. Cl. .............................. 29/890.032; 29/890.03; 29/801; 29/778; 29/773; 72/370.22; 165/104.18; 165/104.19; 165/104.21; 165/104.26; 165/104.27

(58) Field of Classification Search ............ 29/890.032, 29/890.03, 801, 778, 773; 72/370.22; 257/E23.088; 165/104.18, 104.19, 104.21, 104.26, 104.27
See application file for complete search history.

(56) References Cited

U.S. PATENT DOCUMENTS

| 4,341,000 | A | 7/1982 | Stockman | |
|---|---|---|---|---|
| 6,230,407 | B1* | 5/2001 | Akutsu | 29/890.032 |
| 6,524,524 | B1* | 2/2003 | Lin | 419/9 |
| 7,047,639 | B1* | 5/2006 | Sheen | 29/890.032 |
| 7,073,257 | B1* | 7/2006 | Hsu | 29/890.032 |
| 2004/0194311 | A1* | 10/2004 | Hsu | 29/890.032 |
| 2004/0221905 | A1* | 11/2004 | Luo et al. | 138/89 |
| 2005/0022414 | A1* | 2/2005 | Hsu | 34/92 |
| 2005/0051259 | A1* | 3/2005 | Luo | 156/198 |
| 2006/0117557 | A1* | 6/2006 | Li | 29/726 |

FOREIGN PATENT DOCUMENTS

JP 10238976 A 9/1998

* cited by examiner

*Primary Examiner*—David P. Bryant
*Assistant Examiner*—Alexander P Taousakis
(74) *Attorney, Agent, or Firm*—Frank R. Niranjan

(57) ABSTRACT

A method of manufacturing a heat pipe, including the steps of: providing a hollow body with an open end and an opposite close end; filling a predetermined quantity of working fluid into the hollow body through the open end thereof after an interior of the hollow body having been evacuated to a predetermined vacuum degree; and sealing the open end of the hollow body.

4 Claims, 8 Drawing Sheets

APPARATUS AND METHOD FOR MANUFACTURING HEAT PIPE

CROSS-REFERENCES TO RELATED APPLICATION

Relevant subject matter is disclosed in a co-pending U.S. patent application Ser. No. 11/308,376, filed on Mar. 20, 2006 and entitled "METHOD AND APPARATUS FOR MAKING HEAT-DISSIPATION DEVICE HAVING VACUUM CHAMBER AND WORKING FLUID THEREIN", which is assigned to the same assignee with this application. The disclosures of the co-pending application are wholly incorporated herein by reference.

FIELD OF THE INVENTION

The present invention relates to a heat pipe for cooling an electronic component, and particularly to an apparatus and a method for manufacturing the heat pipe.

DESCRIPTION OF RELATED ART

With the ever-increasing density and high power of electronic components, for example, the central processing unit (CPU), memories and logic arrays in high speed computers, the problem of heat generation by the electronic components in close proximate to one another on electronic circuit cards has become of increasing concern to industry. In response to this, over the past several years heat pipes have been developed to help cooling the electronic components.

A heat pipe generally includes a container with a cavity therein and a quantity of working fluid sealed in the cavity. The cavity is vacuum-exhausted to make the working fluid easy to evaporate. The heat pipe transfers heat generated from the electronic components away by the phase change of the working fluid in the cavity. The maximum heat transport capability and the useful temperature range are two factors to determine the heat transfer performance of the heat pipe. The maximum heat transport capability is affected by the quantity of the working fluid contained in the cavity, while the useful temperature range is determined by the degree of perfection of the vacuum in the cavity. The more perfect the vacuum in the heat pipe, the lower the temperature at which the heat pipe begins to work. Therefore, methods for manufacturing the heat pipe have to accurately control the quality of the working fluid and the vacuum degree of the heat pipe, simultaneously.

FIG. 7 shows a conventional method for manufacturing a heat pipe. The method comprises the following steps: (1) offering a tube body 2 having an open end 3 and a wick structure 4 forming on an inner surface thereof; (2) charging the tube body 2 with a quantity of working fluid 5 from the open end 3 of the tube body 2; (3) evacuating air in the tube body 2 to a pre-determined low-pressure vacuum from the open end 3 through a vacuum pump 6, and then sealing the open end 3 to form a heat pipe shown in FIG. 8. The heat pipe comprises an airtight tube body 2 and contains a quantity of working fluid 5 therein. The heat pipe has a sealing portion 7 formed on an end of the body 2. Since the working fluid 5 is filled into the body 2 before the air in the body 2 is pumped out of the body 2, this results in some difficulties in accurately controlling the quality of the working fluid 5 whilst ensuring the perfection of the vacuum in the heat pipe. For example, in the step (3), some of the working fluid 5 evaporates into vapor and is drawn out of the heat pipe by the vacuum pump 6. Thus, the quantity of the working fluid 5 of the heat pipe can be not accurately controlled. Furthermore, the evaporated working fluid 5 results in an increase in pressure in the heat pipe, which leads to errors in checking the degree of perfection of the vacuum in the heat pipe. Therefore, the conventional method for manufacturing heat pipes can not accurately and simultaneously guarantee the quality of the working fluid and the perfection of the vacuum in the heat pipe.

SUMMARY OF INVENTION

A method of manufacturing a heat pipe, comprising the steps of: providing a hollow body with an open end and an opposite close end; filling a predetermined quantity of working fluid into the hollow body through the open end thereof after an interior of the hollow body has been evacuated to a vacuum of predetermined perfection by a vacuum pump connecting with the hollow body via the open end; and sealing the open end of the hollow body.

Other advantages and novel features will become more apparent from the following detailed description of preferred embodiments when taken in conjunction with the accompanying drawings, in which:

DETAILED DESCRIPTION

Figure 1:
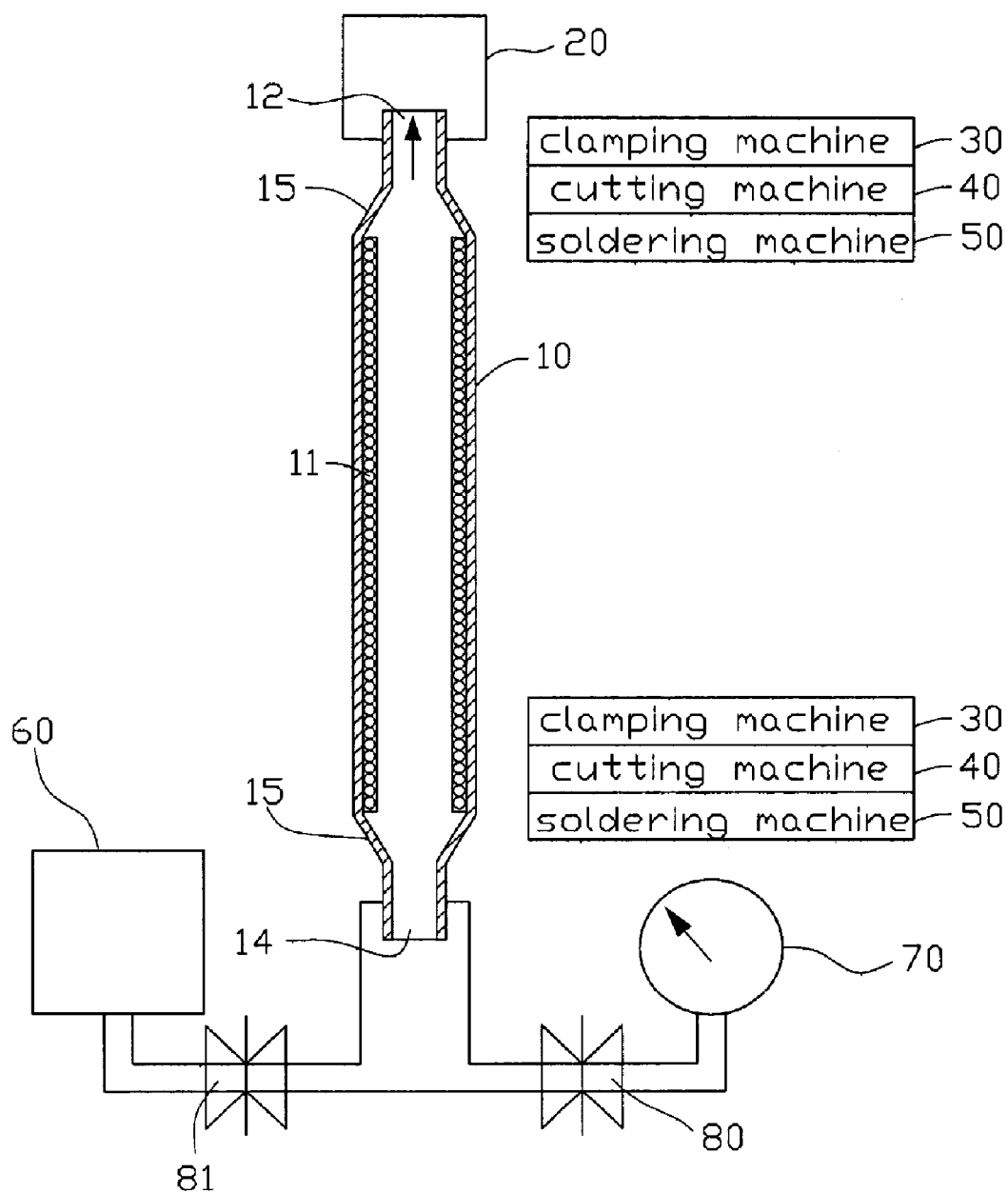
FIG. 1 is a diagrammatic view illustrating an apparatus for making a heat pipe in accordance with a first embodiment of the present invention.

FIG. 1 shows an apparatus for manufacturing a heat pipe in accordance with a first preferred embodiment of the invention. The manufacturing apparatus comprises a vacuum pump 20, two clamping machines 30, two cutting machines 40, two soldering machines 50, a liquid-storage tank 60, a vacuum gauge 70, and a pair of valves 80, 81.

A method for manufacturing a heat pipe by the manufacturing apparatus in accordance with the first embodiment of the present invention comprises the following steps:

(1) Offering a hollow body 10 with a wick structure 11 formed therein, which has a first open end 12 and a second open end 14 opposite to the first open end 12. Each of the open ends 12, 14 is connected with the body 10 via a shrunk portion 15.

(2) Fixing the body 10 to the manufacturing apparatus in such a manner that the vacuum pump 20 is hermetically connected with the first open end 12 of the body 10, while the liquid-storage tank 60 and the vacuum gauge 70 are commonly and hermetically connected with the second open end 14 of the body 10 via a bifurcated tube. The liquid-storage tank 60 and the vacuum gauge 70 are controlled to asynchronously communicate with the body 10 via the valves 80, 81, respectively.

(3) Starting up the vacuum pump 20, and turning on the valve 80, and keeping the vacuum pump 20 working to draw the air originally in the body 10 out of the body 10 until the degree of perfection of the vacuum in the body 10 reaches the pre-designed value, which is then checked using the vacuum gauge 70.

Figure 2:
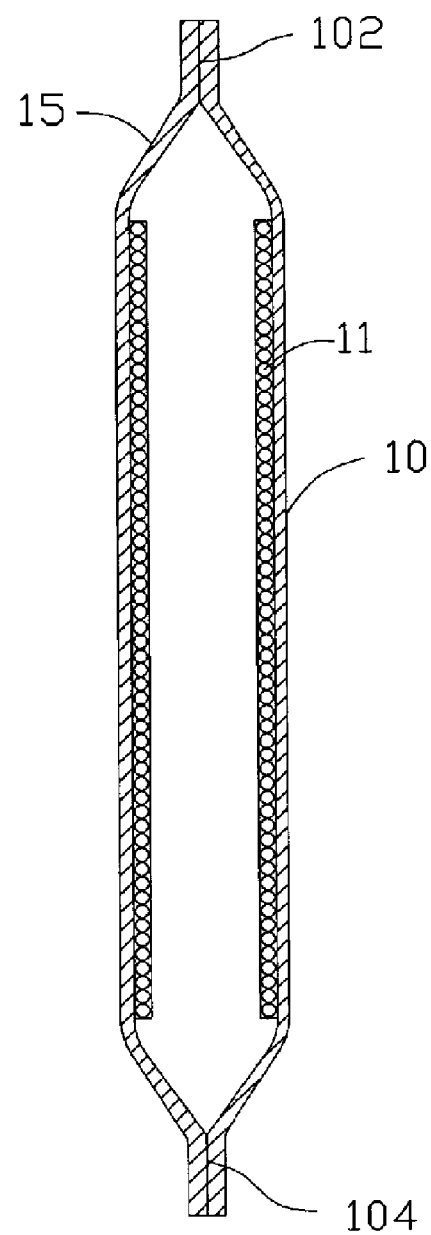
FIG. 2 is a schematic sectional-view of a heat pipe along an axis direction thereof, which is manufactured by the apparatus of FIG. 1.

(4) Closing the valve 80 and sealing the first open end 12, that is, using the clamping machine 30 to press the first open end 12 into a flattened configuration; then using the cutting machine 60 to cut away an excessive distal end portion of the flattened open end; then finally, using the soldering machine 70 to solder the flattened open end so as to hermetically and permanently seal the first open end 12 to thereby form a first sealing portion 102 shown in FIG. 2.

(5). Opening the valve 81 and charging the body 10 with a predetermined quantity of working fluid previously stored in the liquid-storage tank 60, due to the vacuum condition formed in the body 10.

(6). Sealing the second open end 14 to thereby form a second sealing portion 104 shown in FIG. 2 in a manner similar to that of the step (4), thereby manufacturing the heat pipe.

Referring to FIG. 2, a heat pipe manufactured by the above described method is illustrated. The heat pipe comprises an airtight body 10 with the wick structure 11 defined therein and working liquid (not shown) contained therein. A pair of sealing portions 102, 104 is formed on opposite ends of the heat pipe; each of the sealing portions 102, 104 is connected with the body 10 via a corresponding one of the shrunk portions 15. Therefore, each of the end portions of the heat pipe has a tapered cross section. The first sealing portion 102 is formed between the steps (4) and (5), while the second sealing portion 104 is formed after the step (5). Thus, the working fluid for the heat pipe is filled into the body 10 after the body 10 is vacuumed. In this manner, the problem found in conventional art of the previously filled working fluid being inadvertently drawn out of the tube body during the following air-drawing step is effectively eliminated. This avails to accurately control the quantity of the working fluid and the degree of perfection of the vacuum in the heat pipe.

Figure 3:
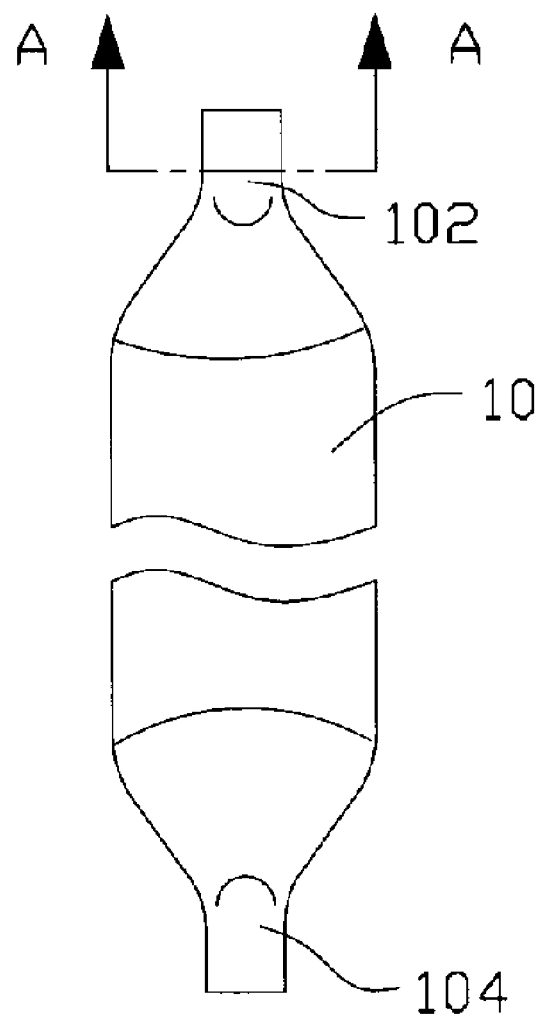
FIG. 3 is a plan view of the heat pipe of FIG. 2, showing an outer configuration of the heat pipe.
Figure 4:
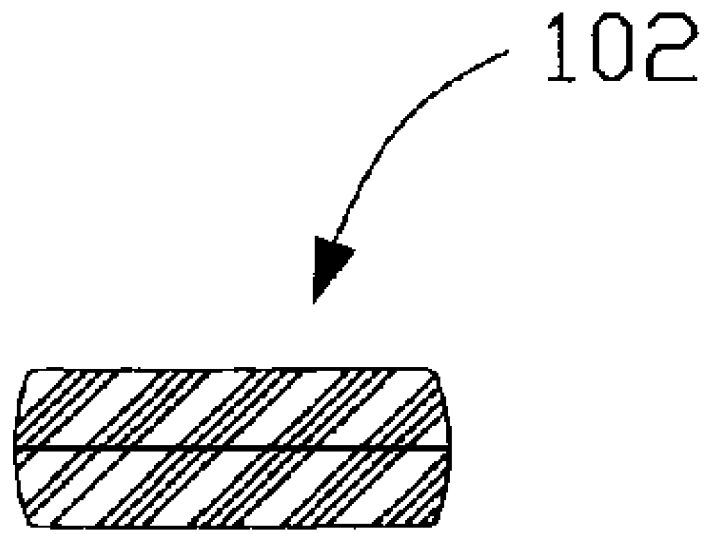
FIG. 4 is a schematic sectional-view of the heat pipe taken along the line A-A of FIG. 3.
Figure 5:
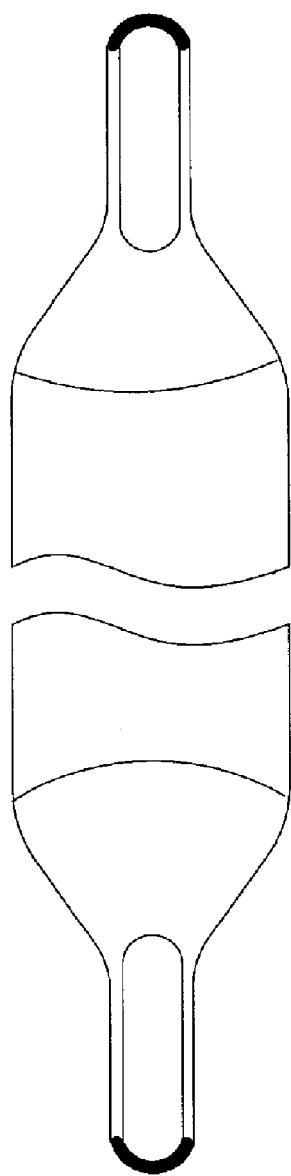
FIG. 5 is a perspective view of another heat pipe manufactured by the apparatus of FIG. 1.

Additionally, the outer configuration of the sealing portions 102, 104 can be changed according to practical requirements. For example, flatten shaped sealing portions shown in FIGS. 3-4 may be shaped by pressing of a pair of flat shaped dies of the clamping machine 30; while arc shaped sealing portions shown in FIG. 5 may be shaped by pressing of a pair of arc shaped dies of the clamping machine 30.

Figure 6:
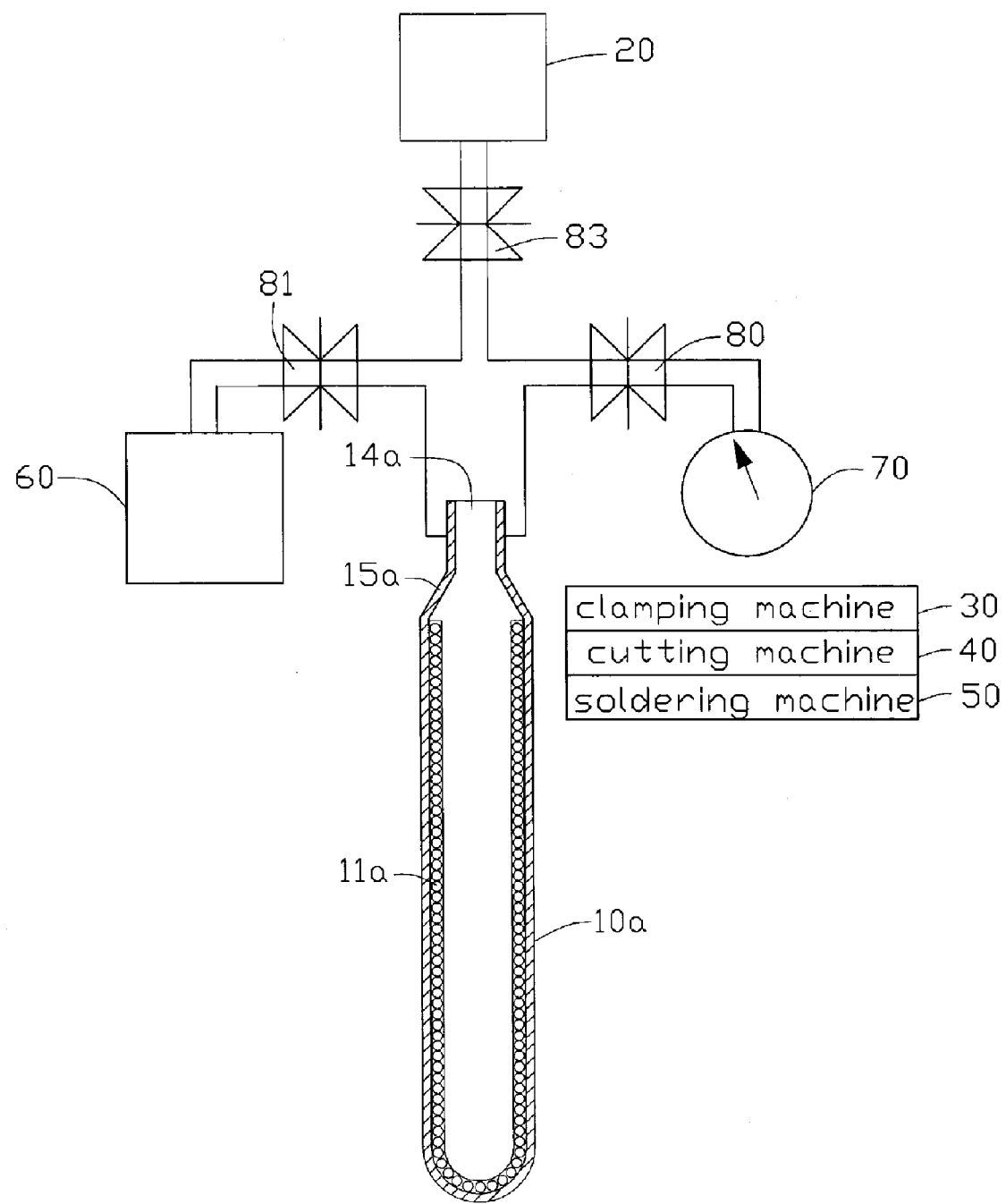
FIG. 6 is a diagrammatic view illustrating an apparatus for making a heat pipe in accordance with a second preferred embodiment of the present invention.
Figure 7:
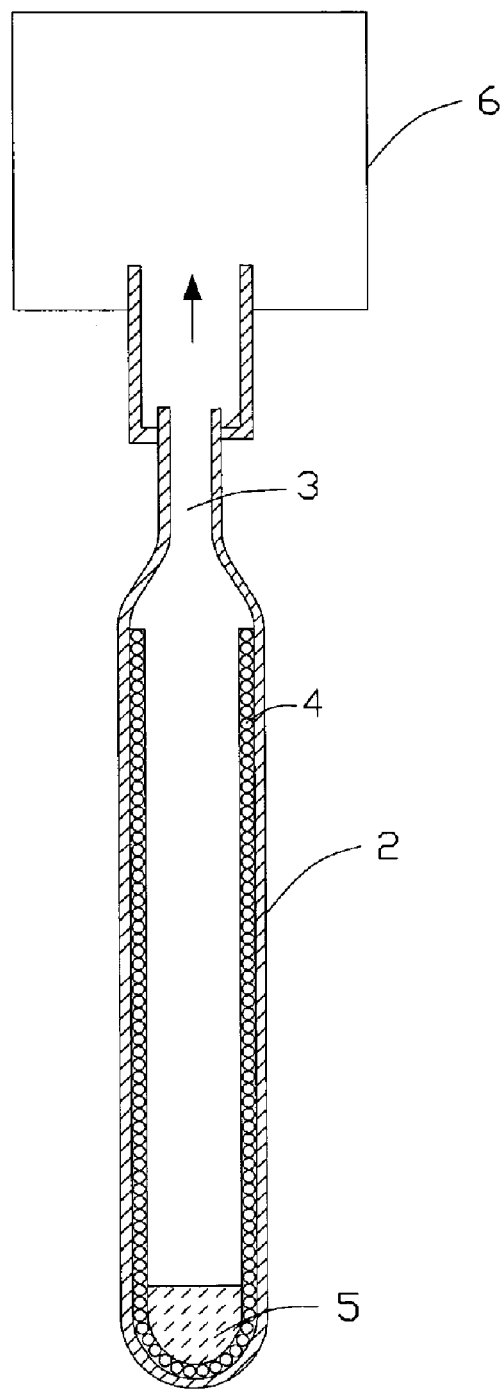
FIG. 7 is a diagrammatic view illustrating a process for making a heat pipe according to a conventional method.
Figure 8:
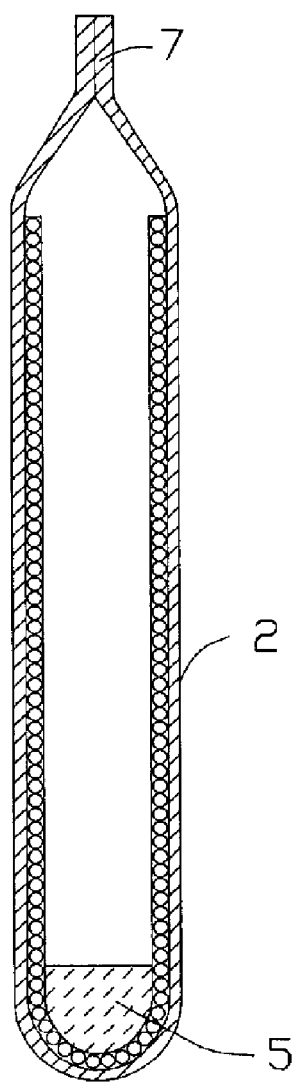
FIG. 8 is a heat pipe manufactured by the conventional method.

FIG. 6 shows an apparatus for manufacturing a heat pipe in accordance with a second preferred embodiment of the invention. The manufacturing apparatus comprises similar components to those of the previously described manufacturing apparatus: a vacuum pump 20, a clamping machine 30, a cutting machine 40, a soldering machine 50, a liquid-storage tank 60, a vacuum gauge 70, and three valves 80, 81, 83.

A method for forming a heat pipe by using the manufacturing apparatus in accordance with the second embodiment of the present invention comprises the following steps: (1) Offering a hollow body 10a with a wick structure 11a formed therein, which has an open end 14a connected with the body 10a via a shrunk portion 15a. An opposite end of the hollow body 10a is closed.

(2) Fixing the body 10a to the manufacturing apparatus in such a manner that the vacuum pump 20, the liquid-storage tank 60 and the vacuum gauge 70 are commonly and hermetically connected with the open end 14a of the body 10 via a trifurcate tube, wherein the vacuum pump 20, the liquid-storage tank 60 and the vacuum gauge 70 communicate with the body 10a via the valves 80, 81, 83, respectively.

(3) Turning on the valves 80, 83, and turning off the valve 81, then starting up the vacuum pump 20, and keeping the vacuum pump 20 working to draw the air originally in the body 10a out of the body 10a until the degree of perfection of the vacuum in the body 10a reaches the pre-designed value, which is then checked by the vacuum gauge 70.

(4) Turning off the valves 80, 83 and turning on the valve 81, then charging the body 10a with a predetermined quantity of working fluid previously stored in the liquid-storage tank 60 due to the vacuum condition formed in the body 10a.

(5) Sealing the open end 14a to thereby form a sealing portion thereby manufacturing the heat pipe. In this manner, the problem in relation to the conventional art where the previously filled working fluid would inadvertently drawn out of the tube body in the following air-drawing step is also effectively eliminated.

Additionally, the heat pipe may have a uniform diameter or gradually changed diameter from one end of the heat pipe to the opposite end.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method of manufacturing a heat pipe, comprising the steps of:

providing a hollow body with an open end and an opposite close end;

evacuating air in an interior of the hollow body through the open end to a predetermined vacuum;

filling a predetermined quantity of working fluid into the hollow body through the open end thereof after the interior of the hollow body has been evacuated to the predetermined vacuum; and sealing the open end of the hollow body;

wherein the predetermined quantity of working fluid is stored in a storage tank before the predetermined quantity of working fluid is filled into the hollow body, the storage tank being connected to the open end of the hollow body;

wherein the degree of perfection of the predetermined vacuum in the hollow body is detected by a vacuum gauge, which is connected to the open end of the hollow body;

wherein the predetermined vacuum degree of the interior of the hollow body is evacuated by a vacuum pump, which is connected to the open end of the hollow body; and wherein the open end of the hollow body is connected with the storage tank, the vacuum gauge and the vacuum pump through a trifurcate tube, wherein the vacuum pump, the liquid-storage tank and the vacuum gauge each communicate with the hollow body via three valves, respectively.

2. The method of claim 1, wherein the sealing step further comprises firstly clamping the open end, then cutting an excess distal end portion of the open end and subsequently soldering the open end; the clamping step, the cuffing step and the soldering step being performed by a clamping machine, a cutting machine and a soldering machine, respectively.

3. An apparatus for manufacturing a heat pipe comprising:
a vacuum pump;
a vacuum gauge;
a liquid-storing tank;
a trifurcate tube having an end adapted for connecting an open end of a hollow tube having a wick structure therein for manufacturing the heat pipe, and three branches respectively connecting with the vacuum pump, the vacuum gauge and the liquid-storing tank.

4. The apparatus of claim 3, farther comprising three valves on the three branches, respectively, adapted for controlling communication between the hollow tube and the vacuum pump, the vacuum gauge and the liquid-storing tank.

* * * * *